(12) United States Patent
Yoo

(10) Patent No.: US 8,976,034 B2
(45) Date of Patent: Mar. 10, 2015

(54) APPARATUS FOR REPORTING FAULT OF BATTERY MANAGEMENT STORAGE SYSTEM USING THE SAME

(75) Inventor: Hwan-Sung Yoo, Yongin-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 184 days.

(21) Appl. No.: 13/561,666

(22) Filed: Jul. 30, 2012

(65) Prior Publication Data

US 2013/0127626 A1    May 23, 2013

(30) Foreign Application Priority Data

Nov. 18, 2011  (KR) .......................... 10-2011-0120747

(51) Int. Cl.
*G08B 21/00* (2006.01)
*G01R 31/36* (2006.01)
*H01M 10/48* (2006.01)

(52) U.S. Cl.
CPC ......... *G01R 31/3689* (2013.01); *H01M 10/488* (2013.01)
USPC .................... 340/636.19; 340/660; 340/693.7

(58) Field of Classification Search
USPC ............... 340/636.19, 636.1, 636.11–636.18, 340/636.2, 641, 660, 649, 691.6, 340/693.1–693.2, 693.7
See application file for complete search history.

(56) References Cited

U.S. PATENT DOCUMENTS

| | | | |
|---|---|---|---|
| 2003/0065370 A1* | 4/2003 | Lebel et al. ...................... 607/60 |
| 2003/0141845 A1* | 7/2003 | Krieger et al. ................ 320/132 |
| 2004/0090195 A1* | 5/2004 | Motsenbocker .............. 318/109 |
| 2005/0182536 A1* | 8/2005 | Doyle et al. ..................... 701/29 |
| 2005/0248311 A1* | 11/2005 | Komaki et al. ................ 320/112 |
| 2010/0277116 A1* | 11/2010 | Reichart et al. ............... 320/101 |
| 2011/0316483 A1* | 12/2011 | Zhang .......................... 320/118 |

FOREIGN PATENT DOCUMENTS

| | | |
|---|---|---|
| JP | 07-282852 | 10/1995 |
| KR | 10-2010-0066765 A | 6/2010 |
| KR | 10-2010-0138172 A | 12/2010 |

* cited by examiner

*Primary Examiner* — Daniel Previl
(74) *Attorney, Agent, or Firm* — Lee & Morse, P.C.

(57) ABSTRACT

An apparatus for reporting fault information of a battery of a power storage system includes a receiving portion configured to receive state information of the battery from a battery management system of the power storage system, a controller configured to produce fault information of the battery from the state information of the battery received by the receiving portion by comparing the state information of the battery with a prestored reference value; and a display configured to display the fault information produced by the controller, wherein the receiving portion and the controller are positioned inside a storage space with the power storage system, and the display is outside of the storage space.

17 Claims, 2 Drawing Sheets

APPARATUS FOR REPORTING FAULT OF BATTERY MANAGEMENT STORAGE SYSTEM USING THE SAME

BACKGROUND

1. Field

Embodiments relate to an energy storage system and, more particularly, to an energy storage system including an apparatus to report a fault of the battery management system.

2. Description of the Related Art

As environmental degradation, resource depletion, etc. become problems, there is an increasing interest in systems for storing power and for efficiently utilizing stored power. Moreover, the importance of renewable energy, such as solar photovoltaic energy, is increasing. Particularly, renewable energy may use natural resources that are infinitely supplied, such as solar, wind and tidal. Such sources of energy do not cause pollution in a power generating process. Therefore, research relating to the utilization of renewable energy is actively being conducted.

SUMMARY

According to an embodiment, there is provided an apparatus for reporting fault information of a battery of a power storage system, the apparatus including a receiving portion configured to receive state information of the battery from a battery management system of the power storage system, a controller configured to produce fault information of the battery from the state information of the battery received by the receiving portion by comparing the state information of the battery with a prestored reference value, and a display configured to display the fault information produced by the controller, wherein the receiving portion and the controller are positioned inside a storage space with the power storage system, and the display is outside of the storage space. The storage space may be a container.

The controller may transmit the fault information to an integrated power management system. The fault information of the battery produced by the controller may be classified into a plurality of fault codes, and the controller may determine whether an error condition exists with respect to each of the fault codes by comparing the state information of the battery according to the plurality of fault codes with a prestored reference value for each fault code.

The display may include a first LED that displays the fault information with respect to each fault code for which an error condition exists, and a second LED that displays lighting intervals of the first LED.

The battery may include a plurality of battery packs that are separately charged and discharged. The plurality of battery packs may be grouped in trays, each tray including a predetermined number of the battery packs, and the trays may be grouped in one or more racks.

Each of the battery packs and/or each of the trays and/or each of the racks may include a battery management module, and each battery management module may intercommunicate with the battery management system of the power storage system.

According to an embodiment, there is provided an energy storage system, including a power generation system configured to generate electrical power, a battery connected to a battery management system, the battery being configured to selectively store power from the power generation system or from a power grid and providing power to a load or to a power grid, a power converter connected to the power generation system and a first node, the power converter being configured to convert the power generated from the power generation system to a voltage of the first node, a bidirectional converter connected to the battery management system and the first node, the bidirectional converter being configured to provide a DC-DC conversion of power from the power grid and power from the power generation system to transfer to the battery, and to provide a DC-DC conversion of power from the battery to transfer to the load or the power grid, an inverter connected to the first node and a second node, the inverter being configured to provide a DC-AC inversion of a voltage input through the first node to transfer to the load or to the power grid and to provide a AC-DC inversion of the power from the power grid to output to the first node, a grid connector connecting the power grid and the inverter, an integrated controller configured to block a connection between the power grid and the power storage system in an abnormal condition by controlling the grid connector, and controlling the power converter, the bidirectional converter, the inverter, the grid connector and the battery, and an apparatus for reporting fault information of the battery, the apparatus including a receiving portion configured to receive state information of the battery from the battery management system; a controller configured to produce fault information of the battery from the state information of the battery received by the receiving portion by comparing the state information of the battery with a prestored reference value; and a display that displays the fault information produced by the controller.

The controller may transmit the fault information to an integrated power management system.

The fault information of the battery produced by the controller may be classified into a plurality of fault codes. The controller may determine whether an error condition exists with respect to each fault code by comparing the state information of the battery according to the plurality of fault codes with a prestored reference value for each fault code.

The battery may include a plurality of battery packs that are separately charged and discharged.

The plurality of battery packs may be grouped in trays, each tray including a predetermined number of battery packs, and the trays may be grouped in one or more racks.

The receiving portion and the controller may be positioned inside an enclosed storage space with the power storage system. The display may be outside of the enclosed storage space.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
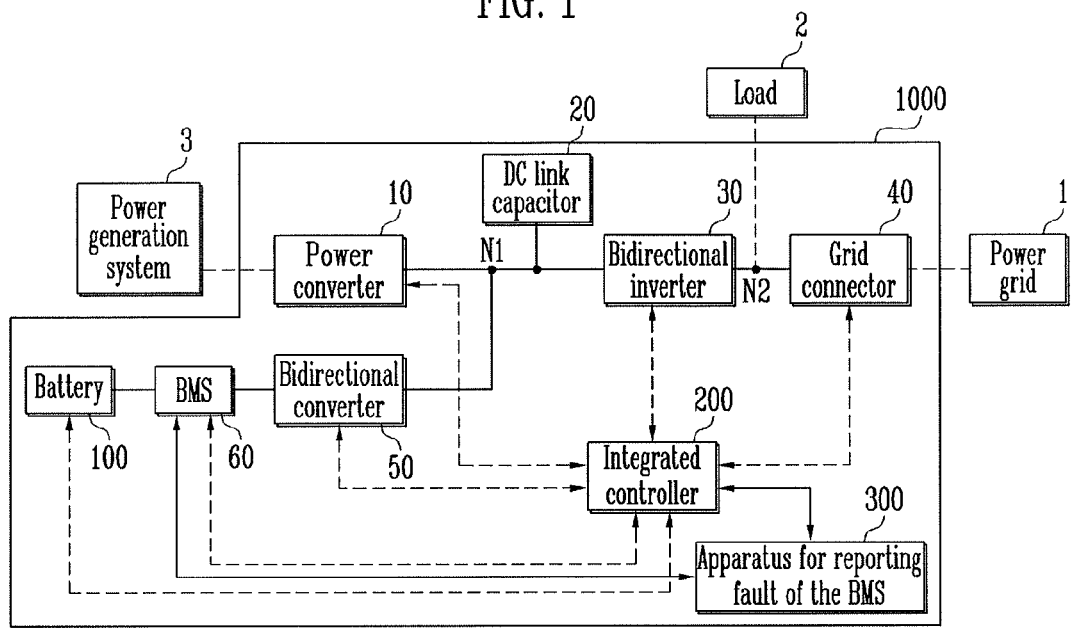
FIG. 1 illustrates a block view showing configurations of an energy storage system according to an exemplary embodiment.

Korean Patent Application No. 10-2011-0120747, filed on Nov. 18, 2011, in the Korean Intellectual Property Office, and entitled: "Apparatus for Reporting Fault of Battery Management System and Energy Storage System Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope to those skilled in the art. Like reference numerals refer to like elements throughout. Also, when an element is referred to as being "connected to" another element, it can be directly connected to the other element or be indirectly connected to the other element with one or more intervening elements interposed therebetween.

FIG. 1 is a block view showing a configuration of an energy storage system according to an exemplary embodiment. However, it is to be understood that such configuration may be varied within a range of design by one skilled in the art.

In FIG. 1, the energy storage system of the embodiment includes a power generation system 3 that generates electrical energy, a load 2 that consumes power, a power grid 1 that transfers electrical energy, and a power storage system 1000.

In the energy storage system of the embodiment shown in FIG. 1, the power produced by the power generation system 3 may be supplied to the load 2 or to the power grid 1 through the power storage system 1000 or may be stored in the power storage system 1000.

Further, the power storage system 1000 may receive power from the power grid 1, and transfer the power to the load 2, or may store the power supplied from the power grid 1. Further, the power stored by the power storage system 1000 may be supplied to the load 2, or may be supplied to the power grid 1, and therefore, a power purchase or sale may be possible.

The power storage system 1000 of the embodiment having a storage space of some size may be provided, for example, in the form of a container.

The power grid 1 is an electrical grid including a power plant, a substation, and transmission lines. In an embodiment, when the power grid 1 is in a normal condition, the power from the power grid 1 may be supplied to the power storage system 1000 or to the load 2. Further, the power grid 1 may receive power from the power storage system 1000 and transfer the received power. When the power grid 1 is in an abnormal condition, the power supply from the power grid 1 to the power storage system 1000 or to the load 2 may be stopped. Further, the power supply from the power storage system 1000 to the power grid 1 may also be stopped.

The load 2 receives power from the power storage system 1000 or receives commercial power from the electric power grid 1. For example, the load 2 may constitute facilities such as houses, buildings and factories consuming the power.

The power generation system 3 converts new energy or renewable energy into electrical energy to supply to the power storage system 1000. In an embodiment, the power generation system 3 may be a new energy and renewable energy power generation system using renewable energy sources such as sunlight, water, geothermal energy, precipitation, or biological organisms. For example, the power generation system 3 may be a photovoltaic system converting solar energy such as solar heat and solar light into electrical energy through a solar cell. In another implementation, the power generation system may be a wind generation system converting wind power into electrical energy, a geothermal power generation system converting geothermal heat into electrical energy, a hydroelectric power system or an ocean power plant system. Further, the power generation system may be a new energy power generation system producing the electrical energy using fuel cells, or producing the electrical energy using hydrogen, coal liquefied gas, or heavy residue oil gas.

In FIG. 1, the power storage system 1000 may store power supplied from the power generation system 3 or the power grid 1, and may supply the stored power to the power grid 1 or the load 2.

The power storage system 1000 may include a power converter 10, a DC link capacitor 20, a bidirectional inverter 30, a grid connector 40, a bidirectional converter 50, a battery management system (BMS) 60, a battery 100, an integrated controller 200, and an apparatus 300 for reporting a fault 300 of a battery 100 of the battery management system.

The power converter 10 may be connected between the power generation system 3 and a first node N1. The power converter 10 may convert the power produced from power generation system 3 into the DC voltage of the first node N1. An operation of the power converter 10 may be varied according to the power generated by the power generation system 3. For example, when the power generation system 3 generates an AC voltage, the power converter 10 may convert the AC voltage into the DC voltage of the first node N1. Further, when the power generation system 3 generates a DC voltage, the power converter 10 may step up or step down the DC voltage into the DC voltage of the first node N1.

For example, when the power generation system 3 is a photovoltaic system, the power converter 10 may be a maximum power point tracking (MPPT) converter detecting the maximum power point according to a solar flux change of solar light or temperature change of solar heat, and producing the power. In addition, the power converter 10 may use various types of converters or rectifiers.

The bidirectional inverter 30 may be connected between the first node N1 and a second node N2 to be connected to the load or the grid connector. The bidirectional inverter 30 may perform a DC-AC inversion or an AC-DC inversion.

The bidirectional converter 50 may convert a DC voltage output from the power grid 1 and converted by the bidirectional inverter 30 or a DC voltage output from the power generation system 3 and passing through the power converter 10 to supply to the battery 100. The bidirectional converter 50 steps up or steps down the DC voltage output from the battery 100 through the battery management system 60 to transfer power to the load 2 or to the power grid 1. For example, when the voltage level of the first node N1 is 380V and the voltage level required for the battery management system 60 is 100V, the battery 100 may be charged by stepping down the DC voltage of 380V into a DC voltage of 100V. Thereafter, the DC voltage of 100V may be stepped up into the DC voltage of 380V, and the stepped up voltage may be supplied to the load 2 or to the power grid 1. The bidirectional converter 50 may include a buck mode operation switch, a synchronous rectifying switch, and an inductor functioning as a filter. In addition, various forms of the bidirectional converter 50 may be used.

A DC link capacitor 20 may be connected between the power converter 10 or the bidirectional inverter 30 and the bidirectional converter 50. The DC link capacitor 20 may stabilize the DC voltage level of first node N1 according to a DC link voltage level. For example, the DC voltage level of the first node N1 may become unstable due to rapid changes in the power produced from the power generation system 3 or due to an instantaneous voltage drop generated from the power grid 1. However, the voltage of the first node N1 may need to be maintained regularly to stably operate the bidirectional inverter 30 and bidirectional inverter 50. The DC link capacitor 20 performs such a role. The DC link capacitor 20 may be configured to include super capacitors, and may use an energy storage device such as a secondary cell.

The grid connector 40 may be connected between the power grid 1 and the bidirectional inverter 30. When the power grid 1 is in an abnormal condition, the grid connector 40 may block a connection between the power storage system 1000 and the power grid 1 under the control of the integrated controller 200.

The grid connector 40 may include switching elements. For example, the grid connector 40 may include a junction transistor (BJT), a field-effect transistor (FET) or the like.

Although not shown in the drawings, a switch may be further connected between the bidirectional inverter 30 and the load 2. The switch may be connected to the grid connector 40 in series, and may block power flowing into the load 2 under control of the integrated controller 200. The switch may be in the form of a junction transistor (BJT), a field-effect transistor (FET) etc.

The battery management system (BMS) 60 may be connected between the battery 100 and the bidirectional converter 50. The battery management system (BMS) 60 may optimally maintain and manage the state of the battery 100. For example, the battery management system (BMS) 60 may control the charging and discharging of the battery reflecting a state of charge (SOC) and a state of health (SOH). Further, an overheating problem of the battery 100 due to a rapid temperature rise may be prevented by controlling the temperature of the battery 100. In more detail, the BMS 60 may include a protection circuit performing sensing functions, such as detecting the voltage, current and temperature of the battery 100, and functions such as charging and discharging prohibition, fuse blowout, and cooling depending on control signal of a microcomputer determining overcharge, over discharge, overcurrent, cell balancing SOC, or SOH, according to the sensing function.

The battery 100 may be connected to the bidirectional converter 50 through the battery management system 60. The battery 100 may receive power from the power generation system 3 or the power grid 1 to become charged. The battery 100 may supply power to the load 2, and sell power to or purchase power from the power grid 1.

Figure 2:
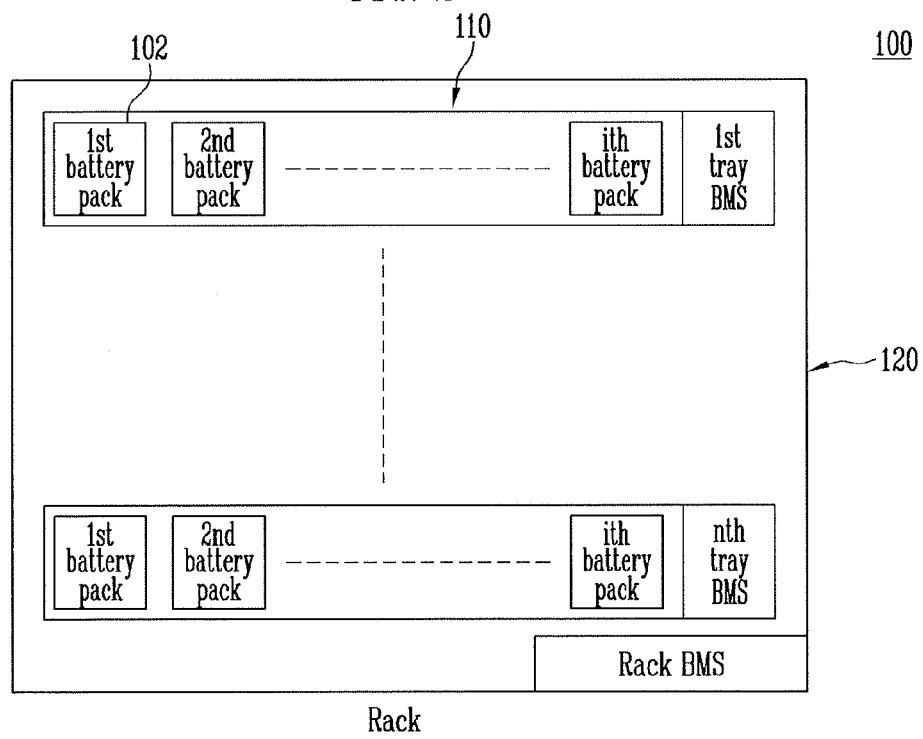
FIG. 2 illustrates a block view schematically showing configurations of a battery in an embodiment shown in FIG. 1.

FIG. 2 is a block view schematically showing a configuration of the battery in the embodiment shown in FIG. 1.

In the embodiment, as shown in FIG. 2, the battery 100 may include a plurality of battery packs 102 capable of charging and discharging separately.

The battery packs 102 may be secondary cells capable of charging and discharging. The battery packs 102 may be medium to large size cells. As examples, a battery pack 102 may be a nickel-cadmium battery, a lead battery, a nickel metal hydride battery, a lithium ion battery, a lithium polymer battery, etc.

In more detail, the plurality of battery packs 102 may be grouped into trays 110, each tray including a predetermined number of battery packs. The trays 110 may be grouped into at least one rack 120.

For example, in FIG. 2, a rack 120 may be provided with n number of trays, and each of the n trays 110 may be provided with i number of battery packs 102. The battery packs 102 provided in each of the trays 110 may be serially connected to each other, and each of the trays 110 may be connected serially or in parallel to each other.

As shown in FIG. 2, for example, one rack 120 may be provided. However, in other implementations, a plural number of racks 120 may be provided according to electric energy to be stored. Each of the racks 120 may be connected serially or in parallel to each other.

Further, each of the battery packs 102, trays 110 and racks 120 may include a battery management system (tray BMS, rack BMS, etc) for each unit.

Therefore, the battery management system (BMS) 60 shown in FIG. 1, which is the BMS of the energy storage system (ESS), may monitor the state of the entire battery 100 by intercommunicating with each BMS of the plurality of battery packs 102, the trays 110 and the racks 120 forming the battery 100, thereby to optimally maintain and manage the battery.

The integrated controller 200 that controls each above-described configured module may sense a normal condition or an abnormal condition, and may control the grid connector 40 to block the grid between the power grid 1 and the power storage system 1000 in an abnormal condition. Further, even in the abnormal condition, in order to store the power generated from the power generation system 3 into the battery 100, the integrated controller 200 may control the battery 100, the battery management system 60, the power converter 10 related to the charging paths of the battery 100, the bidirectional converter 50, etc. Further, in an abnormal condition, in order to perform the function of an UPS (Uninterrupted Power Supply) by supplying the power stored in the battery 100 to the load 2, the integrated controller 200 may control the battery 100, the battery management system 60, the bidirectional converter 50 related to the discharging paths of the battery 100, the bidirectional inverter 30, etc.

Further, the integrated controller 200 may provide communication modules communicating through an integrated power management system (not shown) and networks, and may transmit the amount of electricity used, that is, the amount of electric energy that is supplied to the power grid 1 or consumed by the load 2 of the energy storage system to an integrated power management system by the communication modules.

As mentioned above, the power storage system 1000 may be configured in the form of a container, and the battery 100 may account for most of the inside space of the container.

In particular, since the power storage system of the energy storage system may store much power, the area occupied by the battery packs 102, the trays 110 and the racks 120 configuring the battery 100 may be significantly large, such that it may be significantly dangerous for a person to directly manage and repair the power storage system.

Since the components of the power storage system such as the BMS 60 of the battery 100 may be provided in the container, it may be dangerous for a person to enter the container to check the state information of the battery determined by the BMS 60.

Therefore, in the embodiment, as shown in FIG. 1, an apparatus for reporting fault information 300 of the battery is separately provided.

That is, the apparatus 300 for reporting fault information of the battery 100 receives the state information of the battery 100 monitored by the BMS 60 by communicating with the BMS 60 shown in FIG. 1. That is, the BMS 60 of the energy storage system (ESS) produces fault information for various types of battery conditions by comparing the state information of the battery with reference values. The fault information may be displayed through the display (330 in FIG. 3) provided outside of the container.

Accordingly, the battery state may be immediately checked from the outside of the container provided with the power storage system 1000. In particular, the states of the battery packs may be checked without having a user directly enter the container. Thereby, the battery packs may be rapidly managed while the risks may be minimized.

Figure 3:
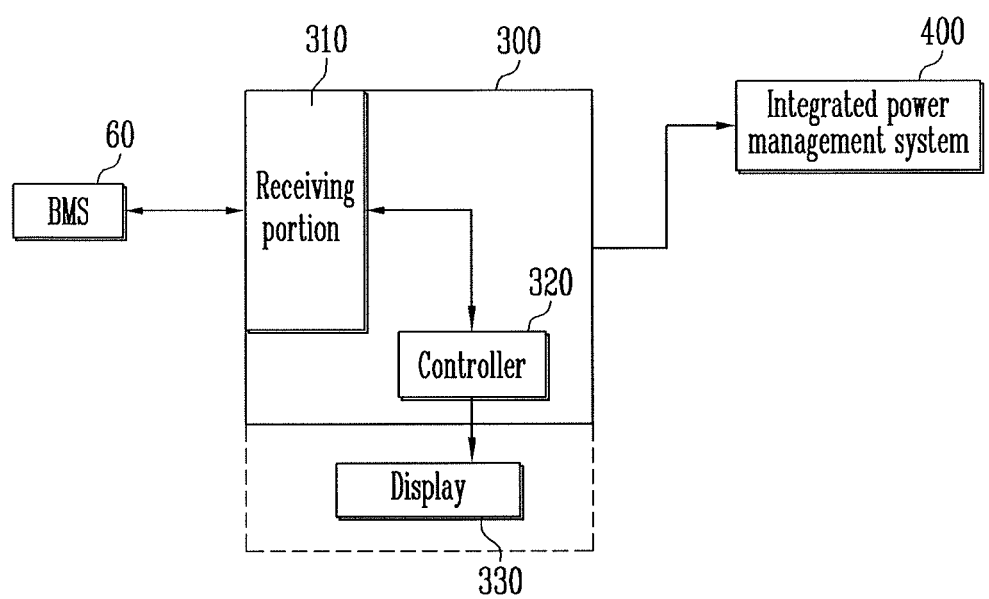
FIG. 3 illustrates a block view schematically showing configurations of apparatus for reporting fault of a battery management system in an embodiment shown in FIG. 1.

FIG. 3 is a block view schematically showing a configuration of the apparatus for reporting fault information of a battery of the battery management system of the embodiment shown in FIG. 1.

In FIG. 3, the apparatus 300 for reporting fault information of the battery may include a receiving portion 310 that receives state information of the battery (100 in FIG. 1) monitored by the BMS 60 of the energy storage system (ESS) by communicating with the BMS 60; a controller 320 that produces the fault information for various types of battery states by comparing the battery state information received by the receiving portion with each reference value; and a display 330 that displays the fault information produced by the controller 320.

The receiving portion 310 and the controller 320 may be integrated with the integrated controller 200 shown in FIG. 1, but the display 330 may be provided on the outside of the container provided with the power storage system 1000.

Further, the controller 320 may transmit the fault information for the battery state to the display 330, and the integrated power management system 400 may be managed on the whole.

Further, the display 330 may display the fault information produced from the controller 320 in various ways. That is, the produced fault information may be displayed in a form that may be manipulated through a touch screen panel, or may be implemented by simply combining LEDs such that a user may intuitively check the state of the fault.

Hereinafter, it is described in more detail that the display 330 may be configured by 2 LEDs (red LED and green LED), and that the state information of the battery received through the BMS 60, that is, the fault state information, may be displayed by the manipulation of the 2 LEDs.

In this embodiment, the fault information for the battery state produced from the controller 320 may be classified into 16 fault codes. The controller 320 may determine whether an error condition exists for each fault code by comparing the battery state information according to the 16 fault codes with a prestored reference value for each fault code, and may direct the display 330 to indicate whether a fault exists with respect to each of the fault codes.

For example, the 16 fault codes may relate to (1) over voltage protection (2) under voltage protection, (3) over temperature protection, (4) over current protection, (5) low temperature protection, (6) over voltage warning/stop, (7) under voltage warning/stop, (8) over temperature warning/stop, (9) over current warning/stop, (10) low temperature warning/stop, (11) imbalance protection, (12) imbalance warning/stop, (13) pack voltage over voltage protection, (14) pack voltage over voltage warning/stop, (15) pack voltage low voltage protection, and (16) pack voltage low voltage warning/stop.

The red LED provided with the display 330 may display the fault code, and the green LED may display time intervals of the red LED. The display 330 may be configured by a first LED displaying the fault code, and a second LED displaying lighting intervals of the first LED.

As a result, for example, detailed operations of the LED according to the 16 fault codes through the display 330 may be as follows. (Hereinafter, the red LED is displayed as RED, and the green LED is displayed as GREEN)

(1) over voltage protection: 0.5 seconds RED 1 time toggle→0.5 seconds GREEN 1 time toggle→0.5 seconds RED only 1 time toggle;

(2) under voltage protection: 0.5 seconds RED 1 time toggle→0.5 seconds GREEN 1 time toggle→0.5 second RED only 2 times toggle;

(3) over temperature protection: 0.5 seconds RED 1 time toggle→0.5 seconds GREEN 1 time toggle→0.5 seconds RED only 3 times toggle;

(4) over current protection: 0.5 seconds RED 1 time toggle→0.5 seconds GREEN 1 time toggle→0.5 seconds RED only 4 times toggle;

(5) low temperature protection: 0.5 second RED 2 times toggle→0.5 seconds GREEN 1 time toggle→0.5 seconds RED 1 time toggle;

(6) over voltage warning/stop: 0.5 seconds RED 2 times toggle→0.5 seconds GREEN 1 time toggle→0.5 seconds RED 2 times toggle;

(7) under voltage warning/stop: 0.5 seconds RED 2 times toggle→0.5 seconds GREEN 1 time toggle→0.5 seconds RED 3 times toggle;

(8) over temperature warning/stop: 0.5 seconds RED 2 times toggle→0.5 seconds GREEN 1 time toggle→0.5 seconds RED 4 times toggle;

(9) over current warning/stop: 0.5 seconds RED 3 times toggle→0.5 seconds GREEN 1 time toggle→0.5 seconds RED 1 time toggle;

(10) low temperature warning/stop: 0.5 seconds RED 3 times toggle→0.5 seconds GREEN 1 time toggle→0.5 seconds RED 2 times toggle;

(11) imbalance protection: 0.5 seconds RED 3 times toggle→0.5 seconds GREEN 1 time toggle→0.5 seconds RED 3 times toggle;

(12) imbalance warning/stop: 0.5 seconds RED 3 times toggle→0.5 seconds GREEN 1 time toggle→0.5 seconds RED 4 times toggle;

(13) pack voltage over voltage protection: 0.5 seconds RED 4 times toggle→0.5 seconds GREEN 1 time toggle→0.5 seconds RED 1 time toggle;

(14) pack voltage over voltage warning/stop: 0.5 seconds RED 4 times toggle→0.5 seconds GREEN 1 time toggle→0.5 seconds RED 2 times toggle;

(15) pack voltage low voltage protection: 0.5 seconds RED 4 times toggle→0.5 seconds GREEN 1 time toggle→0.5 seconds RED 3 times toggle;

(16) pack voltage low voltage warning/stop: 0.5 seconds RED 4 times toggle→0.5 seconds GREEN 1 time toggle→0.5 seconds RED 4 times toggle;

The battery state may be immediately checked even from the outside of the container provided with the power storage system through the lighting operation of the red and green LEDs, that is, through the apparatus 300 for reporting the fault 300 of the battery 100 as determined by the battery management system. The states of the battery packs may be checked without a user having to directly enter the container, thereby allowing the battery packs to be rapidly managed while minimizing the risks.

By way of summation and review, a photovoltaic system, which is an example of an apparatus utilizing renewable energy, converts DC power generated by a solar cell into AC power, and supplies the power to a load by connecting the converted AC power to a grid. When the power generation power of the solar cell is less than the power consumption of the load, all the power of the solar cell is consumed at the load, and a shortage thereof is supplied from the grid. When the power generation power of the solar cell is greater than the power consumption of the load, the extra power, after power has been consumed by the load, is supplied to the grid.

The power storage system may also store extra power provided from the grid at night into energy storage devices, and use the stored extra power by day. Therefore, the power storage system may suppress a peak of the power generation power during the day, and utilize the power at night. The power storage system may use battery packs as energy storage devices, such that a space occupied by the power storage system is reduced, thereby allowing the power storage system to be installed in buildings of general consumers. The power storage system has an advantage of being capable of receiving the power from the battery packs during a power outage.

As a result, the energy storage system (EES), which is a blend of a photovoltaic system and a power storage system, may store the extra power of the solar cell and the grid, supply the extra power to the load if necessary, and stably supply the power to the load even during a power outage.

The power storage system, which is the energy storage device storing the power, may use a plurality of battery packs connected to each other. The power storage system may include a battery management system (hereinafter, refers to as a BMS) to monitor and control state information such as voltage, current, and temperature of each battery pack in order to actively operate the plurality of the battery packs. The BMS may monitor the state information of each battery pack. Accordingly, the states of the battery packs may be checked by the BMS.

However, the energy storage system may store much power, and an area occupied by the battery packs and the BMS may be great. The battery packs may be arranged in a predetermined space. Accordingly, when a person enters the area occupied by the battery packs to check the BMS and directly manage and repair the battery pack having a poor state, there are great risks.

The present embodiments advance the art by providing an apparatus for reporting faults detected by a battery management system and an energy storage system using the same and for minimizing the risk of checking the state of the battery packs, whereby a user does not directly enter a storage are to communicate with the BMS. In particular, fault information from the battery packs and the BMS may be provided to the outside of the storage area of the battery packs.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope as set forth in the following claims.

What is claimed is:

1. An apparatus for reporting fault information of a battery of a power storage system, the apparatus comprising:
    a receiving portion configured to receive state information of the battery from a battery management system of the power storage system;
    a controller configured to produce fault information of the battery from the state information of the battery received by the receiving portion by comparing the state information of the battery with a prestored reference value; and
    a display configured to display the fault information produced by the controller, wherein the receiving portion and the controller are positioned inside a storage space with the power storage system, and the display is outside of the storage space, wherein:
    the battery includes a plurality of battery packs, stores power from a power generation system or a power grid, and provides the power to a load and the power grid, and
    the battery management system provides respective state information of corresponding battery packs to the receiving portion.

2. The apparatus as claimed in claim 1, wherein the storage space is a container.

3. The apparatus as claimed in claim 1, wherein the controller transmits the fault information and amounts of the respective power provided to the load and the power grid to an integrated power management system.

4. The apparatus as claimed in claim 1, wherein:
    the fault information of the battery produced by the controller is classified into a plurality of fault codes, and
    the controller determines whether an error condition exists with respect to each of the fault codes by comparing the state information of the battery according to the plurality of fault codes with a prestored reference value for each fault code.

5. The apparatus as claimed in claim 4, wherein the display includes a first LED that displays the fault information with respect to each fault code for which an error condition exists, and a second LED that displays lighting intervals of the first LED.

6. The apparatus as claimed in claim 1, wherein the plurality of battery packs are separately and independently charged and discharged to each other.

7. The apparatus as claimed in claim 6, wherein:
    the plurality of battery packs are grouped in trays, each tray including a predetermined number of the battery packs, and
    the trays are grouped in one or more racks.

8. The apparatus as claimed in claim 7, wherein:
    each of the battery packs and/or each of the trays and/or each of the racks includes a battery management module, and
    each battery management module intercommunicates with the battery management system of the power storage system.

9. The apparatus as claimed in claim 1, wherein the power storage system is connected to a power generation system and a power grid.

10. The apparatus as claimed in claim 9, wherein the power generation system is configured to generate electrical power, and the power grid is an electrical grid including a power plant, a substation, or transmission lines.

11. The apparatus as claimed in claim 1, wherein the storage space has such a size that a person can completely enter the storage space to repair the battery therein.

12. An energy storage system, comprising:
    a power generation system configured to generate electrical power;
    a battery connected to a battery management system, the battery being configured to selectively store power from the power generation system or from a power grid and provide power to a load or to a power grid;
    a power converter connected to the power generation system and a first node, the power converter being configured to convert the power generated from the power generation system to a voltage of the first node;
    a bidirectional converter connected to the battery management system and the first node, the bidirectional converter being configured to provide a DC-DC conversion of power from the power grid and power from the power generation system to transfer to the battery, and to provide a DC-DC conversion of power from the battery to transfer to the load or the power grid;
    an inverter connected to the first node and a second node, the inverter being configured to provide a DC-AC inversion of a voltage input through the first node to transfer to the load or to the power grid and to provide a AC-DC inversion of the power from the power grid to output to the first node;

a grid connector connecting the power grid and the inverter;

an integrated controller configured to block a connection between the power grid and the power storage system in an abnormal condition by controlling the grid connector, and controlling the power converter, the bidirectional converter, the inverter, the grid connector and the battery; and an apparatus for reporting fault information of the battery, the apparatus including a receiving portion configured to receive state information of the battery from the battery management system; a controller configured to produce fault information of the battery from the state information of the battery received by the receiving portion by comparing the state information of the battery with a prestored reference value; and a display that displays the fault information produced by the controller.

13. The energy storage system as claimed in claim 12, wherein the controller transmits the fault information to an integrated power management system.

14. The energy storage system as claimed in claim 12, wherein the fault information of the battery produced by the controller is classified into a plurality of fault codes, and the controller determines whether an error condition exists with respect to each fault code by comparing the state information of the battery according to the plurality of fault codes with a prestored reference value for each fault code.

15. The energy storage system as claimed in claim 12, wherein the battery includes a plurality of battery packs that are separately charged and discharged.

16. The energy storage system as claimed in claim 15, wherein:

the plurality of battery packs grouped in trays, each tray including a predetermined number of battery packs, and the trays are grouped in one or more racks.

17. The energy storage system as claimed in claim 12, wherein, the receiving portion and the controller are positioned inside an enclosed storage space with the power storage system, and the display is outside of the enclosed storage space.

* * * * *